US012413060B2

(12) United States Patent
Bindi et al.

(10) Patent No.: US 12,413,060 B2
(45) Date of Patent: Sep. 9, 2025

(54) ABOVE RACK CABLE PULL SYSTEM

(71) Applicant: Oracle International Corporation, Redwood Shores, CA (US)

(72) Inventors: Dario Fabio Bindi, Zürich (CH); Thiago Yokoyama dos Santos, Zürich (CH); Mauricio Valerio, Zürich (CH)

(73) Assignee: Oracle International Corporation, Redwood Shores, CA (US)

( * ) Notice: Subject to any disclaimer, the term of this patent is extended or adjusted under 35 U.S.C. 154(b) by 188 days.

(21) Appl. No.: 18/146,952

(22) Filed: Dec. 27, 2022

(65) Prior Publication Data

US 2024/0120723 A1    Apr. 11, 2024

Related U.S. Application Data

(63) Continuation-in-part of application No. 17/962,398, filed on Oct. 7, 2022, now abandoned.

(51) Int. Cl.
*H02G 3/00* (2006.01)
*H02G 1/00* (2006.01)
*H05K 7/14* (2006.01)

(52) U.S. Cl.
CPC ............... *H02G 3/263* (2013.01); *H02G 1/00* (2013.01); *H05K 7/1491* (2013.01); *H05K 7/1497* (2013.01)

(58) Field of Classification Search
CPC ............ H02G 3/263; H02G 1/00; H02G 1/02; H02G 7/053; H02G 3/0456; H02G 7/05; H05K 7/1497; H05K 7/1491; F16L 3/06
See application file for complete search history.

(56) References Cited

U.S. PATENT DOCUMENTS

| 457,335 | A | * | 8/1891 | Albert | ...................... D06F 53/04 |
| | | | | | 242/388.6 |
| 846,313 | A | * | 3/1907 | Johnson | ................... B61B 9/00 |
| | | | | | 104/177 |

(Continued)

FOREIGN PATENT DOCUMENTS

| CN | 113824074 A | 12/2021 |
| JP | 2013073411 A | 4/2013 |
| WO | 2011013090 A2 | 2/2011 |

OTHER PUBLICATIONS

"2U Double-Sided Slotted Duct Cable Manager", CableSupply. com, Available Online at: https://cablesupply.com/2u2sidedcm/, Accessed from internet on Feb. 16, 2022, 4 pages.

(Continued)

*Primary Examiner* — Steven T Sawyer
(74) *Attorney, Agent, or Firm* — Kilpatrick Townsend & Stockton LLP

(57) ABSTRACT

Disclosed is a system for positioning cables within a server room, which includes a wire-pulley system which includes a wire operably coupled to a first pulley wheel and a second pulley wheel. The wire is looped around the first and second pulley wheel such that a point in the wire is laterally movable between the first and second pulley wheels when the first and second pulley wheels are rotated. The system for positioning cables includes a cable carrier which is removably coupled to the point in the wire. The cable carrier includes a central body defining an elongated vertical structure. The cable carrier includes a plurality of posts extending laterally from the central body, where gaps defined between adjacent posts define receiving slots, where each of the plurality of receiving slots are configured to removably receive a segment of an electronics cable.

14 Claims, 5 Drawing Sheets

(56) References Cited

U.S. PATENT DOCUMENTS

| | | | |
|---|---|---|---|
| 847,035 A * | 3/1907 | White et al. | ............. B61B 9/00 |
| | | | 104/177 |
| 2,425,141 A | 8/1947 | Bernau | |
| 2,869,709 A | 1/1959 | Zebley | |
| 3,051,011 A | 8/1962 | Zebley | |
| 3,421,187 A | 1/1969 | Ryder | |
| 5,564,658 A * | 10/1996 | Rinderer | ............... H02G 3/263 |
| | | | 248/68.1 |
| 6,483,709 B1 | 11/2002 | Layton | |
| 6,884,942 B2 | 4/2005 | McGrath et al. | |
| 7,857,670 B2 | 12/2010 | Mcgrath et al. | |
| 9,104,387 B1 * | 8/2015 | Eichelberg | ............. A47B 46/00 |
| 9,270,097 B2 | 2/2016 | Krietzman et al. | |
| 9,948,076 B1 | 4/2018 | Davey et al. | |
| 10,154,608 B1 | 12/2018 | Johnson et al. | |
| 10,834,838 B1 | 11/2020 | Ross et al. | |
| 10,888,013 B2 | 1/2021 | Jochim et al. | |
| 2004/0226900 A1 | 11/2004 | Canty et al. | |
| 2005/0185363 A1 | 8/2005 | Rasmussen et al. | |
| 2006/0029354 A1 | 2/2006 | Follingstad et al. | |
| 2011/0127476 A1 * | 6/2011 | Ballard | ................... H02G 3/30 |
| | | | 254/134.3 R |
| 2011/0147542 A1 * | 6/2011 | Hoek | ....................... H02G 3/32 |
| | | | 248/68.1 |
| 2020/0244054 A1 * | 7/2020 | Brandvold | ........... H02G 3/0456 |
| 2022/0255300 A1 * | 8/2022 | Rand | ......................... F16L 3/06 |
| 2023/0369833 A1 * | 11/2023 | Bumstead | ............... F16L 3/223 |

OTHER PUBLICATIONS

"32623-703 Motive® Double-Sided Vertical Cable Manager", Available Online at: https://www.chatsworth.com/en-us/products/racks-cable-management/cable-management/vertical/motive-double-sided-vertical-cable-manager/32623-703#productDocumentationID, 1 page.

"4" Wide Vertical Cable Manager WMPV45E", Panduit, Available Online at: https://www.panduit.com/content/dam/panduit/en/products/media/7/67/867/2867/109902867.pdf, 2 pages.

"45U 6.7" Wide Plastic Dual Sided High Capacity Vertical Cable Management (2) 22.5U Sections", FiberZon, Available Online at: http://www.fiberzon.com/45u-67-wide-plastic dual-sided-high-capacity-vertical-cable-management-2-225u-sections-p-19761.html, 1 page.

"Energy Data and Energy for Data Centers—Now and in the Future: Sivacon 8PS LData Busbar Trunking System", Siemens, Available Online at: https://assets.new.siemens.com/siemens/assets/api/uuid:e276a0b7-a825-4a92-9cc0-c488400c734f/sids-b10022-00dbldatasivacon8psenus-144.pdf, 2020, 4 pages.

"High Density Network Rack (HDNR)", Eaton, Available Online at: https://www.eaton.com/au/en-gb/catalog/server-racks-enclosures-airflow-management/high-density-network-rack.html, Accessed from Internet on Feb. 14, 2022, 4 pages.

"Huber+Suhner North American Structured Cabling Solutions", Available Online at: https://literature.hubersuhner.com/Marketsegments/Communication/data-center-nam-2017/?page=24, pp. 11-28.

"MNPCTech Ethernet Network Cable Combos", MNPCTech.com, Available Online at: https://www.mnpctech.com/products/mnpctech-ethernet-network-cable-combs, 10 pages.

"NetRunner™ Vertical Cable Managers", Available Online at: https://www.panduit.com/content/dam/panduit/en/products/media/5/95/495/3495/110183495.pdf, 2 pages.

"New Busbar Trunking System Enables Higher Energy Efficiency for Data Centers of Tomorrow", Siemens, Available Online at: https://press.siemens.com/global/en/pressrelease/new-busbar-trunking-system-enables-higher-energy-efficiency-data-centers-tomorrow, Accessed from Internet on Feb. 15, 2022, 2 pages.

"Patch Cable Holder for Modular Synthesists", Synthtopia, Available Online at: https://www.synthtopia.com/content/2014/03/16/patch-cable-holder-for-modular-synthesists/, Mar. 16, 2014, 7 pages.

"PATCHBOX: Simplify IT", Available Online at: https://cdn.competec.ch/documents2/3/2/7/199103723/199103723.pdf, 4 pages.

"PATCHBOX® : The New Standard in Network Rack Cabling", Patchbox, Available Online at: https://patchbox.com/patchbox-cabling-system/, Accessed from Internet on Feb. 14, 2022, 11 pages.

"Professional VR Cable Management for Oculus Quest 2 Link Cable, FANPL Ceiling Suspension Pulley System for Oculus Rift/Rift S/HTC Vive/Vive Pro VR Accessories (6 Pack)", Ubuy, Available Online at: https://www.u-buy.jp/en/product/1CEFDWDO-professional-vr-cable-management-for-oculus-quest-2-link-cable-fanpl-ceiling-suspension-pulley-syste, 3 pages.

"Pulley System Eases Installation of Additional Cables in Cable Tray", Available Online at: https://www.cablinginstall.com/design-install/cabling-installation/article/16468292/pulley-system-eases-installation-of-additional-cables-in-cable-tray, Mar. 1, 1997, 6 pages.

"Quest™ Ring Style Vertical Rack Cable Manager", Available Online at: https://www.cableorganizer.com/categories/racks/cable-management/vertical/quest-ring-vertical-cable-manager/, 1 page.

U.S. Appl. No. 17/962,390, "Non-Final Office Action", May 13, 2025, 8 pages.

* cited by examiner

ABOVE RACK CABLE PULL SYSTEM

CROSS-REFERENCES TO RELATED APPLICATIONS

This application is a continuation-in-part of U.S. application Ser. No. 17/962,398, filed Oct. 7, 2022, entitled "ABOVE RACK CABLE PULL SYSTEM," which is related to U.S. application Ser. No. 17/962,390, filed Oct. 7, 2022, entitled "ABOVE RACK CABLE PULL SYSTEM," the entire contents of which are incorporated herein by reference for all purposes.

BACKGROUND

A server system (e.g., in a data center) often requires the interconnection of a number of large, free-standing server racks to provide the necessary infrastructure to provide suitable data storage and operating performance of the system. To provide the necessary power and data connections between server racks, a large number of power and network cables often span between server racks within a server room. In some configurations, the server room is designed for the cables to be advanced above the server racks, and the server room may include shelves or baskets above the server racks to hold and organize the plurality of cables. In various configurations, the server room may include a network rack which inter-connects with a multitude of server racks, which each provide data storage/processing capabilities.

When installing a new server rack within a server room, it may be necessary to interconnect the new server rack with other server racks, the network rack, and with power. Each of these connections may require cables which span large distances. For example, the network rack may be positioned across the server room from the new server rack, with a plurality of server racks positioned in between. As such, according to one current approach, a technician may utilize a ladder to incrementally advance the cables to the new server rack. Depending on the distance, the technician may be required to pull the cables as far as they can reach at a given position, and then repeatedly reposition the ladder to subsequently pull the cables farther across the distance between the server racks.

This current approach is time-consuming, particularly in large server rooms where the distance between the server racks requires a large number of iterations of repositioning the ladder. In addition, the cables can be delicate, and increased contact and disruption of the cables can cause damage. Finally, frequent climbing of a ladder increases risk of injury to the technician.

As such, there is a need for a system for positioning various cables within a server room, which increases efficiency and reduces risk of damage to the cables, and reduces risk of injury to the technician.

BRIEF SUMMARY

Modern data centers often include dozens, if not hundreds, of interconnected free-standing server racks, which are designed to provide suitable data storage and operating performance for a server system. As each of the server racks may include a plurality of servers, often a single rack within the data center requires a large number of cables to interconnect with other racks in the server system. For example, a given server rack may require a number of cables (i.e. communication cables, power cables, etc.) to run to the network rack. As the number of server racks increases, both the number of necessary fiber and electronics cables as well as the distances of travel for such cables may expand, creating further complications in managing and efficiently installing a particular server rack.

For example, as a particular server system expands, an additional free-standing server rack may need to be added to meet the requirements of the server system. Such a process includes the installation of the various servers, as well as the process of running cables to their necessary locations to allow the "new" server rack to interconnect with the rest of the system. As such an occurrence is not unusual within a data center, it is beneficial that systems and accompanying methods be utilized which promote the efficiency and reliability of such installation processes.

Many data centers utilize "above-the-rack" cabling methods, where the cables are routed above the server racks, such as in a basket or shelf that holds the cables once they are installed. In current techniques, the installation of a new server, or other circumstance in which a new cable is added above the rack, a technician slowly advances the cable or cables manually from a starting point to the destination. This process (particularly in larger server systems) is slow-going, and may require positioning of a ladder at a number of incremental positions between the starting point and the destination, to allow for further arm's reach to advance the cables. Beyond the time consumption required for repeated advancement of the cables, such a process carries additional risk in damaging the network cables with repeated manipulation of the cable. Furthermore, frequent scaling and descaling of the ladder presents a safety risk to the technician that they may fall or otherwise become injured.

The systems and devices described herein, and the accompanying methods, provide an improved system and method to advance fiber and electronics cable positioning, such as for installation in a server rack. In particular, the disclosure allows for a technician to minimize the number of placements of a ladder in order to advance the electronic cables. According to various implementations, the above rack cable pull system herein may provide an improved system for positioning cables within a server room. Such a system may allow for the technician to connect the cables with the system at a starting position, and advance the cables all the way to the destination at once, rather than through incremental manual advancements. Such an approach reduces likelihood of injury to the technician in repeated ladder usage, damage to the cables from being repeatedly manipulated by the technician, and increased efficiency in advancing the cables.

In one aspect, the system for positioning cables within a server room may include a wire-pulley system, which may include a wire operably attached to a first pulley wheel and a second pulley wheel. The wire may be looped around the first and second pulley wheels, such that a particular point in the wire is laterally movable between the pulley wheels when the pulley wheels are rotated. In various implementations, the pulley wheels may be positioned such that the wire spans a distance between various server racks, or across a server room. Preferably, the wire-pulley system is positioned above the server racks.

In one aspect, the system for positioning cables may include a cable carrier, which may be removably attached or attachable to the wire-pulley system. For example, the cable carrier may attach at a fixed point along the wire such that lateral movement of the wire between the pulleys laterally advances the cable carrier.

The cable carrier may include a central body defining an elongated vertical structure, and may further include a plurality of posts extending laterally from the central body. For example, the posts may extend in a first direction and a second direction, opposite to the first direction. Thus, the cable carrier may resemble a generally planar structure, having a plurality of posts extending in opposite lateral directions from the central body.

Gaps defined between adjacent posts of the plurality of posts may define a plurality of receiving slots, where each of the plurality of receiving slots is configured to removably receive a segment of various cables. For example, the segment may be a portion of the electronics cable, such as a portion located proximal with ana cable connector (e.g. an electronics plug). For example, when a number of electronics cables are being moved, such as for installation of a new server rack, each of the electronics cables may be inserted into respective receiving slots, for example such that the portion immediately before the cable connector is inserted into the receiving slot, such that the portion is maintained within the receiving slot. For example, the receiving slot may be dimensioned to receive the segment of the fiber cable, but may be unsuitable to receive the cable connector (as the cable connector is generally larger than the fiber cable itself). As such, when force is applied upon the giver cable, such as during motion of the cable carrier, the fiber cable may be prevented from being pulled through and out of the receiving slot, as the cable connector may be too wide to traverse through the receiving slot.

In one aspect, the receiving slots may comprise an engaging structure positioned within the receiving slots within the proximal portion of the receiving slots, such as the portion of the receiving slot closest to the central body of the cable carrier. The engaging structure may occupy a portion of the gaps defined between the adjacent posts, such that the distance (i.e. height) at the proximal portion of the receiving slot is less than the height at a distal portion of the receiving slot. Such a height reduction may provide additional frictional engagement on the segment of the cable inserted within the receiving slot.

The engaging structure may be made from a deformable material, such as plastic, polymers or foam, which deforms when pressure is applied upon insertion of the electronics cable within the engaging structure. Beyond providing additional friction upon the electronics cable (compared to the height of the receiving slot without the engaging structure), the engaging structure may further provide variability for the receiving slot to retain cables of various dimensions, as the engaging structure may act as a spring, to deformably engage a variety of cable sizes.

In one aspect, the plurality of posts may be upwardly angled from a perpendicular direction relative to the central body. For example, the posts may be angled such that receiving slot slopes downwards from the distal opening to the proximal end. Such angle may assist a user or technician in placing the cables within the receiving slot, as gravity may assist in directing the cables distally into the receiving slot. Similarly, the angle of the receiving slot may encourage the segment of the cable to stay secured within the receiving slot, as escaping the receiving slot would require both lateral traversal through the receiving slot, but also upwards motion against gravity.

In another aspect, a method for positioning cables within a server room includes providing the wire-pulley system positioned above a plurality of server racks within a server room. The wire-pulley system may include a wire operably coupled to a first pulley wheel and a second pulley wheel, where the wire may be looped around the first and second pulley wheels.

In some aspects, the method may include providing a cable carrier removably attached to a point in the wire. The cable carrier may include a central body defining an elongated vertical structure and may include a plurality of posts extending laterally from the central body. The gaps defined between adjacent posts may define receiving slots. The receiving slots may be dimensioned to have a height that corresponds with the diameter of various cables (or thickness in the case of non-circular cables).

In some aspects, the method may include positioning the cable carrier above a first server rack of the plurality of server racks. In some aspects, the method may include inserting a segment of the cable within a receiving slot of the cable carrier. For example, the method may include inserting segments of multiple cables into respective receiving slots of the cable carrier. In some aspects, the method may include pulling the wire, such that the first and second pulley wheels are caused to rotate, whereby the cable carrier is moved laterally form above the first server rack to above a second server rack of the plurality of server racks. For example, the second server rack may be positioned away from the first server rack, such that a number of other server racks are positioned therebetween. In some aspects, the method may include removing the segment of the electronics cable from the receiving slot.

Implementations of the techniques and hardware covered by this disclosure are defined by the claims below, not this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this disclosure, all drawings, and each claim.

DETAILED DESCRIPTION

Implementations of the present disclosure are related to devices, systems for an above rack cable system having a cable carrier, and methods of use of the same.

Figure 1A:
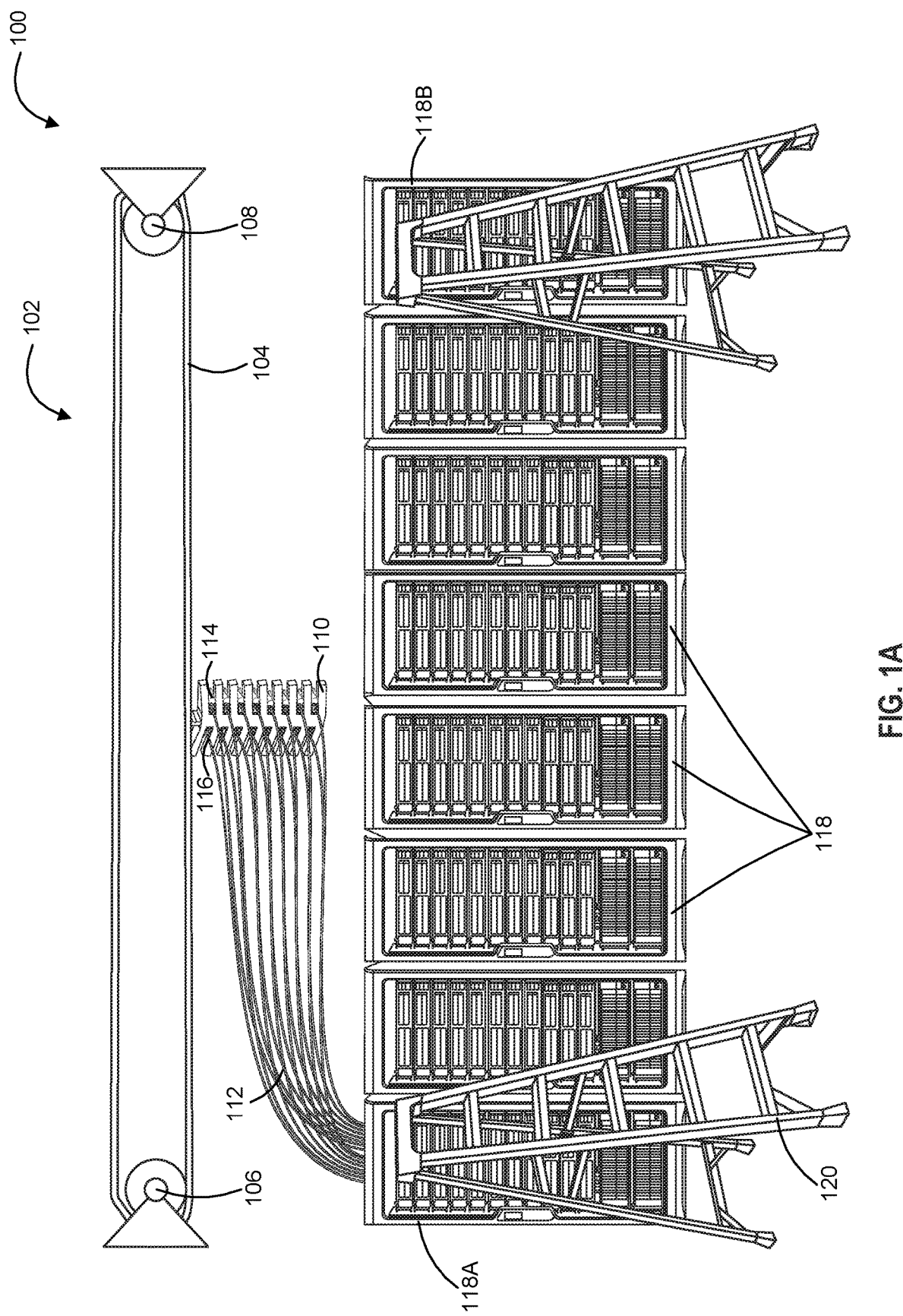
FIG. 1A illustrates a front view of an exemplary above rack pull system according to implementations of the present technology.
Figure 1B:
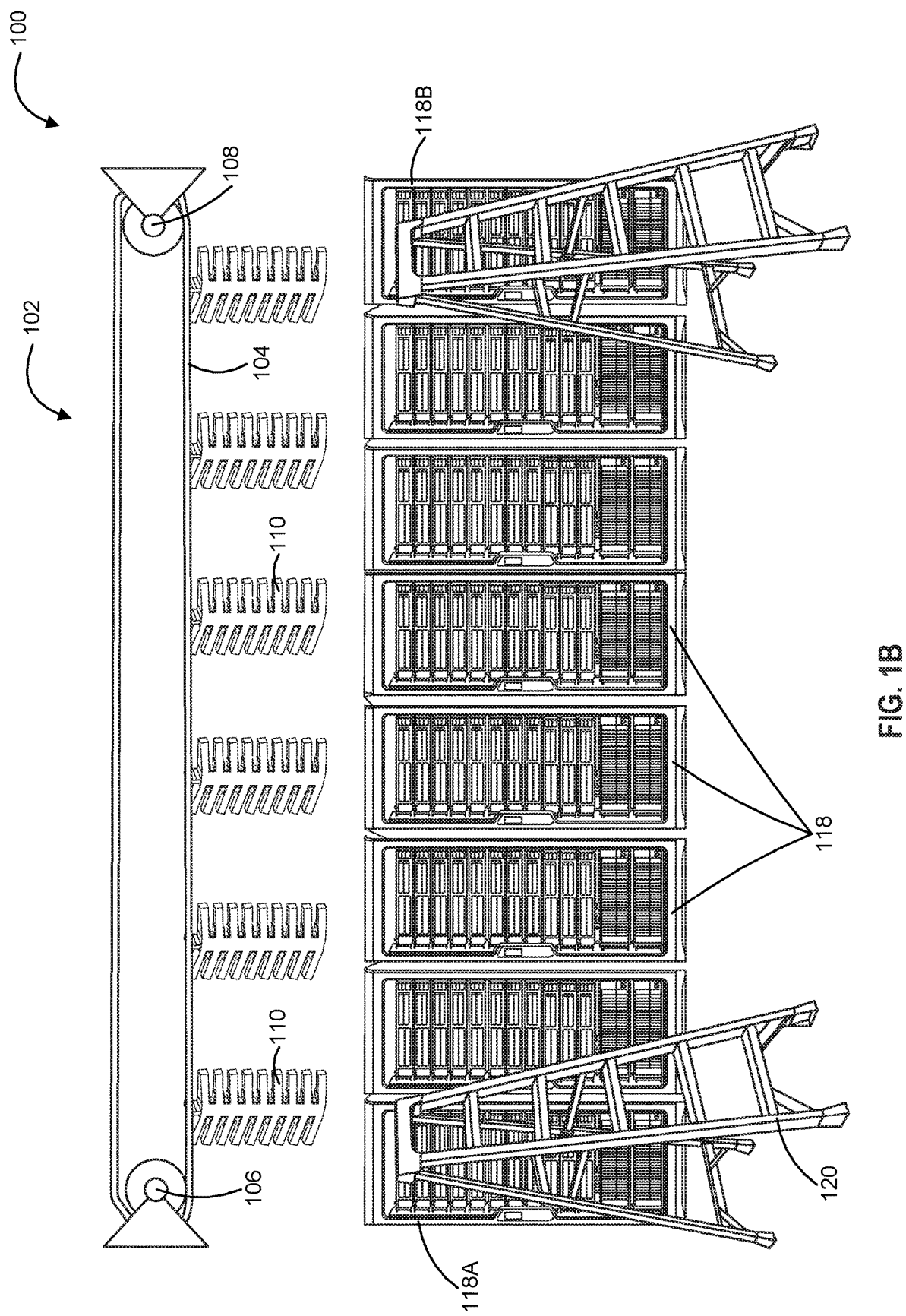
FIG. 1B illustrates a secondary front view of the above rack pull system of FIG. 1A, illustrating lateral movement of the cable carrier.

Referring now to the drawings, in which like reference numerals represent like parts throughout the several views, FIGS. 1A-1B illustrate aspects of a system 100 for positioning cables within a server room according to various aspects of the present disclosure. The system 100 may include a wire-pulley system 102, which may include a wire 104, a first pulley 106, and a second pulley 108. The wire 104 may be looped around the first pulley 106 and second pulley 108, such as illustrated, such that a point (or portion) of the wire is laterally movable between the first pulley 106 and the second pulley 108, such as when the first pulley 106 and second pulley 108 are rotated. Such rotation may occur for example, by pulling on the wire 104, or by rotation of one of the first pulley 106 and the second pulley 108. The wire-pulley system 102 may be positioned above a plurality of server racks 118 of the server room. For example, the first pulley 106 and second pulley 108 may be mounted or otherwise attached to walls within the server room, such as at opposite sides of the server room, such that the wire 104 spans a distance above the server racks 118.

According to various implementations, the system 100 may include a cable carrier 110 (shown in greater detail in FIG. 2), which may be removably coupled to a point (or portion) of the wire 104. The cable carrier 110 may be designed such that one or more cables 112 may be received by the cable carrier 110. Each of the one or more cables 112 may include a cable connector 114 at a distal end of an cables 112. The cable connector 112 may be referred to as a plug, or connector for ultimately plugging the electronics cable 112 into an electronic device such as a server (e.g. a server within a server rack). As shown, a segment 116 of the one or more cables 112, such as a portion of the cables 112 locate proximally to the cable connector 114, may be received by the cable carrier 110 to removably couple the cables 112 with the cable carrier 110.

In various implementations, the server room may include a plurality of server racks 118, which may each house a plurality of servers. For example, the plurality of server racks 118 may include a first server rack 118A, which for purposes of illustration may be the server rack 118 in which the one or more cables 112 are attached (plugged in). For example the first server rack 118A may be a network server.

A technician may desire (or a server layout may require) interconnection between the first server rack 118A and one of the various other plurality of server racks 118. For example, a technician may require interconnection between the first server rack 118A and a second server rack 118B via the one or more cables 112. As such, the segment 116 of the one or more cables 112 may be received by the cable carrier 110. According to various implementations, the segment 116 of the one or more cables 112 may be received by the cable carrier 110 prior to the cable carrier 110 being attached to the wire 104 of the wire-pulley system 102. In such configurations, the segment of the one or more electronic cables 112 may be removably received by the cable carrier 110 proximal to the first server rack 118A, and subsequently attached to the wire 104, such as at a point above or nearly above the first server rack 118A. For example, a ladder 120 may be positioned near the first server rack 118A to allow a technician to reach the wire 104 for attachment of the cable carrier 110.

According to various implementations, the cable carrier 110 may be attached to the wire 104 of the wire-pulley system 102, and the segment 116 of the one or more cables 112 may be subsequently received by the cable carrier 110. For example, a technician may utilize the ladder 120 to attach the segment 116 of the cable 112 to the cable carrier 110 at a position above or nearly above the first server rack 118A.

After the cables 112 have been received by the cable carrier 110, the cable carrier 110 may be advanced laterally from a position above or nearly above the first server rack 118A to a position near the intended destination of the one or more cables 112. For example, as illustrated, the cable carrier 110 may be advanced laterally to a position above or nearly above the second server rack 118B. FIG. 1B illustrates a progression over time of the motion of the cable carrier 110 being advanced between the first server rack 118A and the second server rack 118B.

Once the cable carrier 110 has been advanced to its intended destination, such as above the second server rack 118B, the segment 116 of the one or more cables 112 may be removed from the cable carrier 110. As discussed with attaching the segment 116 of the cables 112 to the cable carrier 110, the segment 116 may be removed from the cable carrier 110 while the cable carrier 110 remains attached to the wire 104 of the wire-pulley system 102. Alternatively, the cable carrier 110 may be removed from the wire 104, and the segment 116 of the cables 112 may be subsequently removed from the cable carrier 110.

While not shown, the sever room may further include a basket, a shelf, or other structure which retains the one or more cables 112 subsequent to their installation. According to various implementations, the basket or shelf may be positioned below the wire-pulley system 102, and may retain the one or more cables 112 after their removal from the cable carrier 110.

Figure 2:
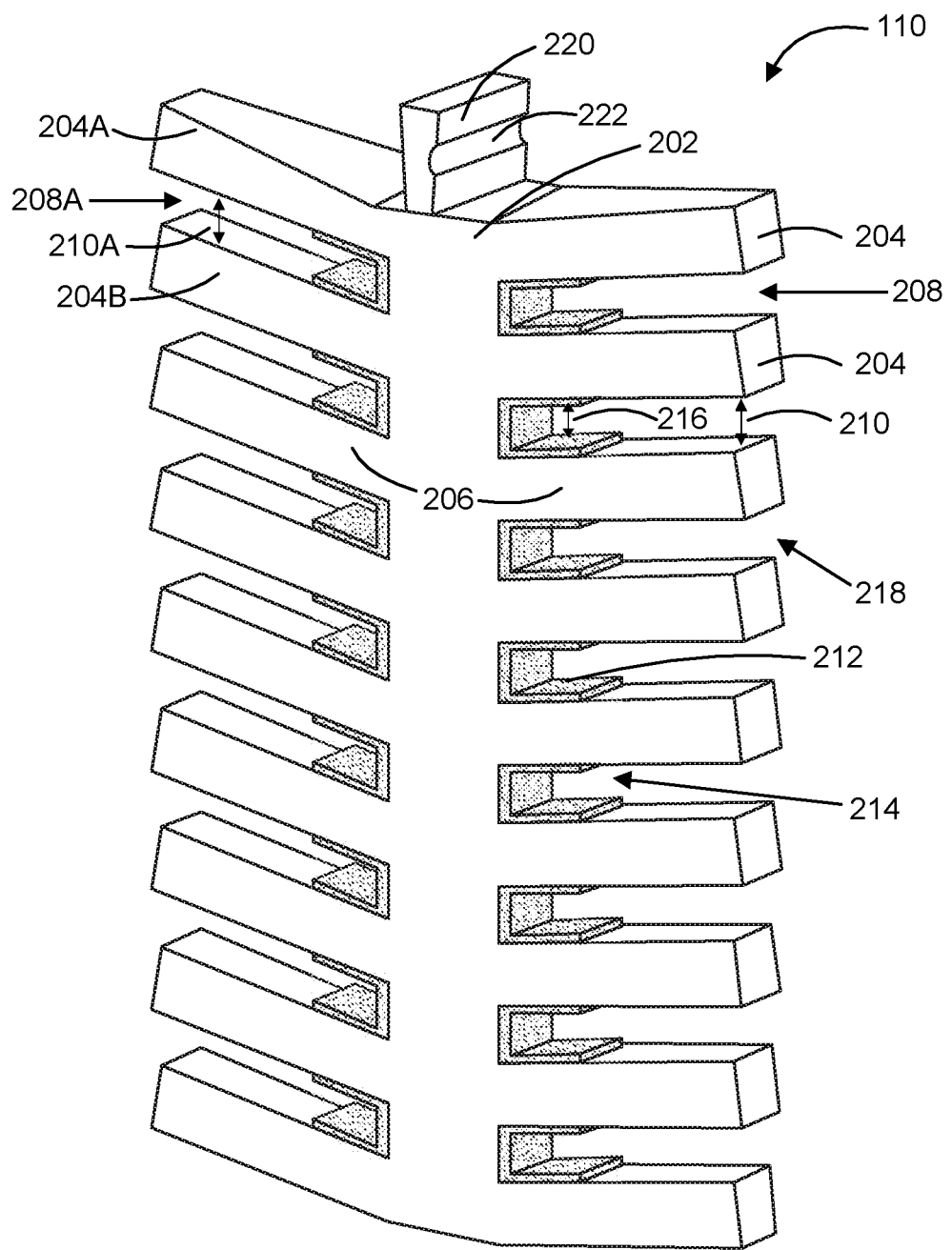
FIG. 2 illustrates a front perspective view of an exemplary cable carrier according to implementations of the present technology.

FIG. 2 illustrates a front perspective view of an exemplary cable carrier 110 according to implementations of the present technology. The cable carrier 110 may include a central body 202 defining an elongated vertical structure. A plurality of posts 204 may extend laterally from the central body 202. For example, the posts 204 may extend laterally in two opposite lateral directions from the central body 202, such that the cable carrier 110 may have a generally planar structure, having oppositely opposed pairs 206 of posts 204. The cable carrier 110 may include any number of posts 204, for example the cable carrier 110 may include 4, 6, 8, 10, 12, 14, 16, 18, or more posts, or any number therebetween. The posts 204 may have a generally square or rectangular cross section, or may be round or oval according to various implementations.

Posts 204 which are adjacent to each other may define gaps therebetween. The gaps between adjacent posts 204 may each define a plurality of receiving slots 208, which may be configured or dimensioned with a height 210 to removably receive a segment 116 of an electronics cable 112, as shown and discussed in further detail with regards to FIG. 3. For example, post 204A and post 204B are adjacent to one another, and a gap between post 204A and post 204B may define a receiving slot 208A, which may be dimensioned with a height 210A to correspond to a given electronics cable.

The receiving slots 208 of the cable carrier 110 may each include an engaging structure 212. The engaging structure 212 may be embedded or positioned within and/or may be attached to a portion of the inner surfaces of the receiving slots 208. For example, the engaging structure 212 may occupy a proximal portion 214 of the receiving slots 208 closest to the central body 202 of the cable carrier 110. As such, the engaging structure 214 may occupy a portion of the height 210 of the receiving slots 208 such that a height 216 within the engaging structure 214 is less than the height 210 of the receiving slots 208. Such a height reduction at the proximal portion 214 of the receiving slot 208 may provide additional frictional engagement on the segment 116 of the electronics cable 112 when positioned within the receiving slots 208.

The engaging structure 212 may be made from a deformable material, such as plastic, polymers or foam, which deforms when pressure is applied upon insertion of the cables 112 within the engaging structure 212. Beyond providing additional friction upon the electronics cable 112 (compared to the height 210 of the receiving slot without the engaging structure), the engaging structure 212 may further provide variability for the receiving slot 208 to retain cables 112 of various dimensions, as the engaging structure 212 may act as to provide deformability to deformably engage a variety of sizes of cables 212. As such, the segment 116 of the electronics cable 112 may be pushed proximally towards the proximal portion 214 of the receiving slot 208 until the segment 116 is frictionally engaged within the receiving slot 208.

The plurality of posts 204 may be upwardly angled from a perpendicular direction relative to the central body 202. For example, the posts 204 may be angled such that receiving slot 208 slopes downwards from a distal opening 218 to the proximal portion 214. Such angle may assist a user or technician in placing the cables 112 within the receiving slots 208, as gravity may assist in directing the cables 112 distally into the receiving slot 208. Similarly, the angle of the receiving slot 208 may encourage the segment 116 of the electronics cable 112 to stay secured within the receiving slot 208, as escaping the receiving slot 208 would require both lateral traversal through the receiving slot 208, but also upwards motion against gravity.

The cable carrier 110 may further include an attachment knob 220 which may protrude upwardly from the central body 202, and may be centered relative to the overall width of the cable carrier 110. The attachment knob 220 may provide a location for attachment of the cable carrier 110 to the wire 104 of the wire-pulley system 102. For example, the attachment knob 220 may include a wire channel 222 defined within a side of the attachment knob 220. The wire channel 222 may be dimensioned to correspond with a circumference of the wire 104, such that the wire 104 may be fully or partially retained within the with wire channel 222. According to various implementations, the attachment knob 220 may further include an attachment mechanism (not shown) to removably retain the wire 104 within the wire channel 222. For example, the attachment mechanism may include a strap, or a hook-loop fastener strap, a clasp, a hook, or other similar features as would be appreciated by one skilled in the art. According to various implementations, the attachment knob 220 may be further dimensioned as a hook-shape, such that the wire channel is more fully defined within the attachment knob, such that a technician may hook the attachment knob 220 over the wire 104 to removably secure the cable carrier 110 to the wire 104. As such, the attachment knob may be structured similarly to a clothes hangar to removably attach the cable carrier 110 to the wire.

Figure 3:
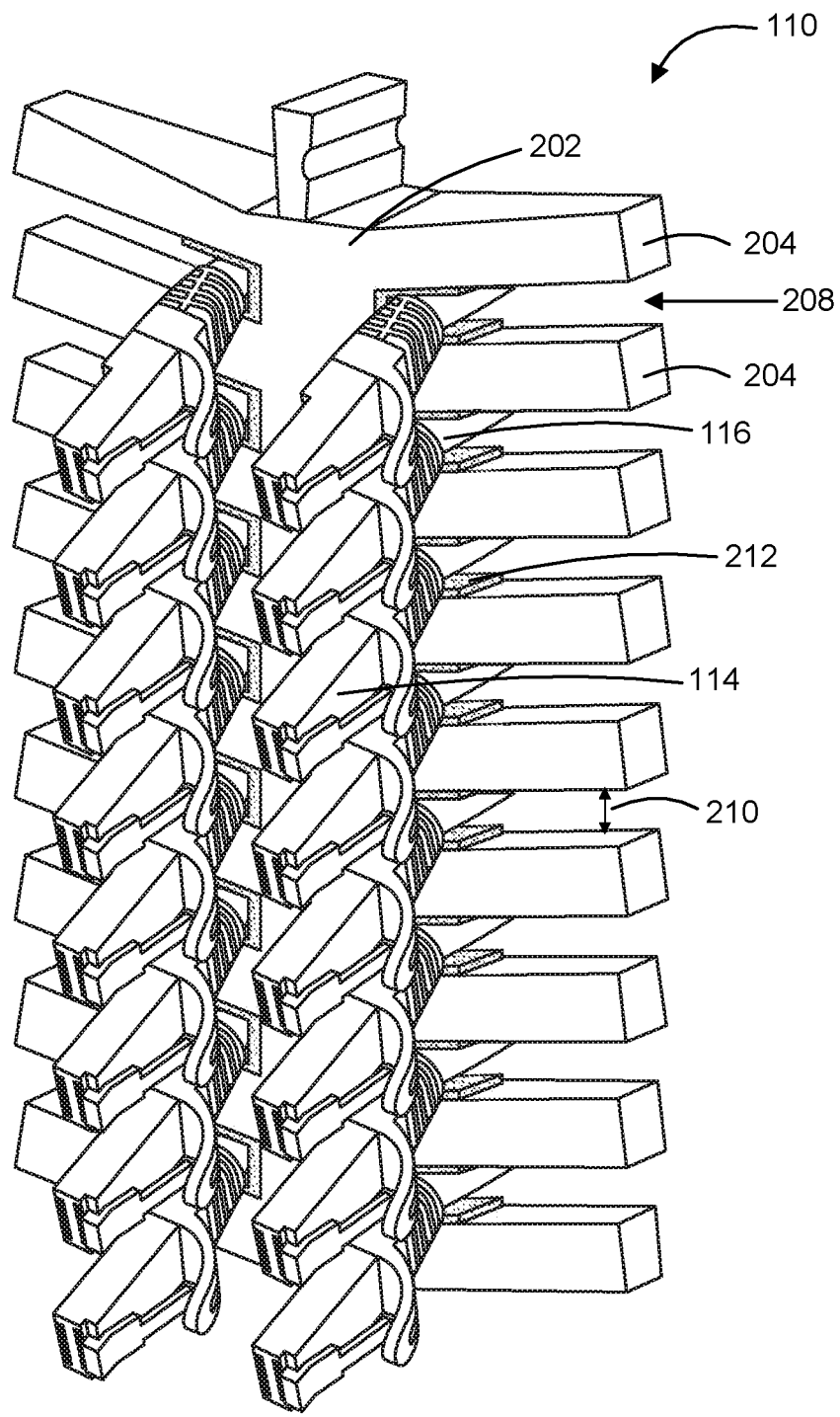
FIG. 3 illustrates the cable carrier of FIG. 2 with cables positioned within the receiving slots of the cable carrier.

FIG. 3 illustrates the cable carrier 110 of FIG. 2 with a portion 116 of the cables 112 inserted within respective receiving slots 208 of the cable carrier 110. As shown, the portion 116 of the cables 112 is the portion proximal to the cable connector 114. As such, the portion 116 of the electronics cable 112 is removably engaged within the receiving slot 108, and in particular is frictionally engaged and removably secured within the engaging structure 212. As illustrated, the cable connectors 114 of the plurality of cables 112 may be larger than the size of the segment 116 of the cables 112. As such, the receiving slot 208 may be dimensioned such that the segment 116 may be received within the receiving slot 208, but the height 210 of the receiving slot 208 may be too narrow to allow passage of the cable connector 114. Thus, if a pulling force is applied to the cables 112, such as when the cable carrier 110 is in motion and is pulling the cables 112 laterally, the cable connector 114 may not be able to bypass the receiving slot 208 and thus the segment 116 may remain retained within the receiving slot 208.

While FIG. 3 illustrates the plurality of cables 112 having the same size electronics cable 112 and same type of cable connector 114 throughout, it should be appreciated that the cable carrier 110 may accommodate different sizes of cables 112, and different types of cable connectors 114. For example, the cable connector 110 may be capable of maintaining different types of cables 112 within respective receiving slots 208 at the same time. For example the cable connectors 114 may include a QSFP cable connector, a RJ45 cable connector, a SFP cable connector, and other similar cable connectors as appreciated by one skilled in the art.

Figure 4:
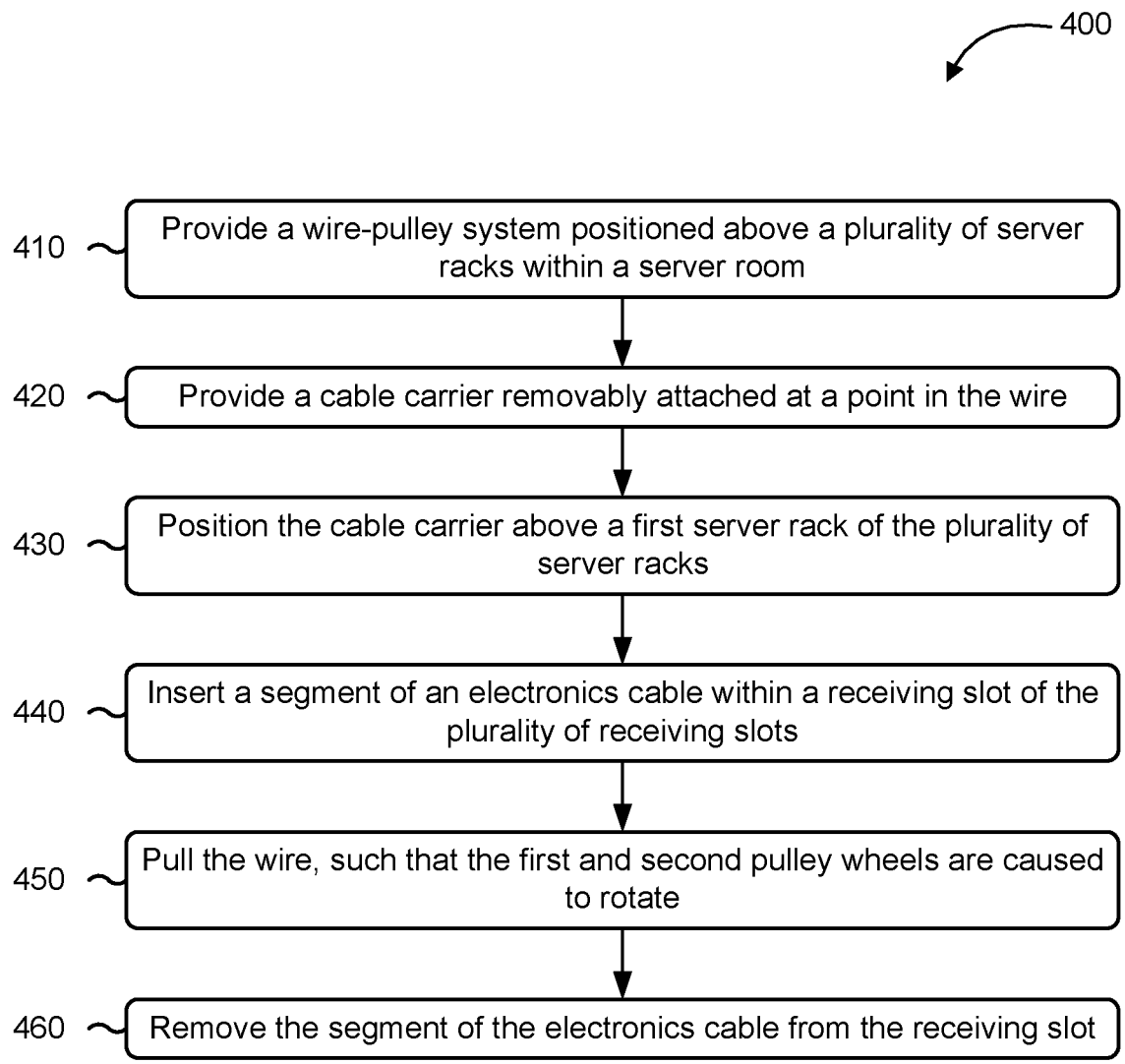
FIG. 4 illustrates a flowchart of an exemplary process of positioning cables within a server room according to various implementations of the present technology.

FIG. 4 is a flowchart of an exemplary process 400 for positioning cables (e.g. cables 112) within a server room. In some implementations, one or more of the process blocks of FIG. 4 may be performed manually, such as by an operator, user, technician, or the like. This process is illustrated as a logical flow diagram, each operation of which can be implemented manually, in hardware, computer instructions, or a combination thereof. In the context of computer instructions, the operations may represent computer-executable instructions stored on one or more computer-readable storage media that, when executed by one or more processors, perform the recited operations. Generally, computer-executable instructions include routines, programs, objects, components, data structures and the like that perform particular functions or implement particular data types. The orders in which the operations are described are not intended to be construed as a limitation, and any number of the described operations can be combined in any order and/or in parallel to implement the processes or the method.

At block 410, the process 400 may include providing a wire-pulley system (e.g. wire pulley system 102) positioned above a plurality of server racks (e.g. server racks 118) within a server room. The wire-pulley system may include a wire (e.g. wire 104) operably coupled to a first pulley wheel (e.g. pulley wheel 106) and a second pulley wheel (e.g. pulley wheel 108). The wire may be looped around the first and second pulley wheels, such that a point in the wire is capable of lateral movement as the first and second pulley wheels are rotated.

At block 420, the process 400 may include providing a cable carrier (e.g. cable carrier 110) to removably attach to a point in the wire. The cable carrier may include a central body (e.g. central body 202) defining an elongate vertical structure. The cable carrier may include a plurality of posts (e.g. plurality of posts 204) extending laterally from the central body. The plurality of posts may define gaps defined between adjacent posts to define receiving slots (e.g. receiving slots 208).

The process 400 may further include attaching the cable carrier to the wire of the wire-pulley system. Attaching the cable carrier may include positioning an attachment knob (e.g. attachment knob 220) proximal to the wire. Attaching the cable carrier may further include positioning the wire within a wire channel (e.g. wire channel 222) of the attachment knob. Attaching the cable carrier may further include securing the cable carrier to the wire using various attachment mechanisms (e.g. a strap or clasp).

At block 430, the process 400 may include positioning the cable carrier above the first server rack (e.g. first server rack 118A) of the plurality of server racks. Positioning the cable carrier above the first server rack may occur prior to or subsequently to inserting a segment of an electronics cable within a receiving slot of the plurality of receiving slots.

At block 440, the process 400 may include inserting a segment (e.g. segment 116) of an electronics cable (e.g. electronics cable 112) within a receiving slot of the plurality of receiving slots. The receiving slots may have a height (e.g. height 210) corresponding to a diameter (or size) of the segment of the electronics cable, such that the segment of the electronics cable may be frictionally engaged within the receiving slot. Inserting the segment of the electronics cable may occur prior to positioning the cable carrier above the first server rack of the plurality of server racks. Alternatively, inserting the segment of the electronics cable may occur subsequently to positioning the cable carrier above the first server rack of the plurality of server racks. For example, the segment of the electronics cable may be inserted within the receiving slot prior to attaching the cable carrier to the wire. Inserting the segment of the electronics cable may include pushing the segment into the receiving slot to overcome friction provided by an engaging structure (e.g. engaging structure 212) positioned within the receiving slot, such that the engaging structure frictionally engages the segment of the electronics cable to retain the electronics cable within the receiving slot. The receiving slots may be upwardly angled from a perpendicular direction relative to the central body of the cable carrier, such that the receiving slot slopes downward from a distal opening (e.g. distal opening 218) to a proximal portion (e.g. proximal portion 214).

At block 450, the process 400 may include pulling the wire, such that the first and second pulley wheels are caused to rotate. Such pulling may cause the cable carrier to move laterally from above the first server rack to above a second server rack (e.g. second server rack 118B). Pulling the wire may be performed by a technician, and may include the technician pulling the wire while positioned near the first server rack or near the second server rack. Pulling the wire may be performed by a technician climbing a ladder, or otherwise elevating themselves, to be positioned proximally to the first server rack or the second server rack.

At block 460, the process 400 may include removing the segment of the electronics cable from the receiving slot. Removing the segment may include overcoming friction provided between the cable connector and the receiving slot and/or engaging structure provided in the receiving slot, and may further include pulling the cable outwardly from the receiving slot.

The process 400 may further include detaching the cable carrier from the point in the wire. Detaching the cable carrier from the point in the wire may include releasing an attachment mechanism from the wire and removing the attachment knob from contact with the wire. Detaching the cable carrier from the point in the wire may occur while the electronics cable is maintained within the receiving slot.

The detailed description of example implementations refers to the accompanying drawings. The same reference numbers in different drawings may identify the same or similar elements. In the following description, for the purpose of explanation, numerous specific details are set forth in order to provide an understanding of various implementations of the subject matter. It will be evident, however, to those skilled in the art, that implementations of the inventive subject matter may be practiced without these specific details. In general, well-known structures and techniques are not necessarily shown in detail.

It is understood that the examples and implementations described herein are for illustrative purposes and that various modifications or changes in light thereof will be suggested to persons skilled in the art and are to be included within the spirit and purview of this application and the scope of the appended claims.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, some potential and preferred methods and materials are now described.

As used herein "a cable" or "electronics cable" may refer to various cables used for transferring power and/or data signals from one end to another. For example a fiber cable which carries light and laser based signals. Conversely, a "wire" as used herein may refer to a non-electrical component, such as a metal wire, a rope, or similar device. While cables are often interchangeably referred to as "wires" in the art, this application is specifically drafted to have a wire acting as a structural feature rather than an electronics cable for transferring power and/or data for purposes of clarity and to avoid unnecessary confusion.

It must be noted that as used herein and in the appended claims, the singular forms "a", "an", and "the" include plural referents unless the context clearly dictates otherwise. Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present disclosure.

What is claimed is:

1. A system for positioning electronics cables within a server room, comprising:
    a wire-pulley system comprising a wire operably coupled to a first pulley wheel and a second pulley wheel, wherein the wire is looped around the first and second pulley wheel such that a point in the wire is laterally movable between the first and second pulley wheels when the first and second pulley wheels are rotated; and
    a cable carrier, removably coupled to the point in the wire such that the cable carrier is laterally movable between the first and second pulley wheels when the first and second pulley wheels are rotated, the cable carrier comprising a central body defining an elongated vertical structure, and a plurality of posts extending laterally from the central body, wherein gaps defined between adjacent posts define a plurality of receiving slots, and wherein each of the plurality of receiving slots are configured to removably receive a segment of an electronics cable.

2. The system of claim 1, wherein the receiving slots comprise an engaging structure positioned within the receiving slots and coupled with a proximal portion of the receiving slots, wherein the engaging structure provides a decreased height at the proximal portion of the receiving slot relative to a distal portion of the receiving slot, such that the engaging structure is configured to provide frictional engagement with the segment of the electronics cable.

3. The system of claim 2, wherein the engaging structure is made from a deformable material, such that the engaging structure is configured to deform when the segment of the electronics cable is positioned within the receiving slot.

4. The system of claim 1, wherein the receiving slots are dimensioned such that a cable connector coupled with a distal end of the electronics cable is incapable of passing through the receiving slot, such that the electronics cable cannot be pulled through the receiving slot when the segment of the electronics cable is positioned within the receiving slot.

5. The system of claim 1, wherein the cable carrier further comprises an attachment knob extending vertically from the central body of the cable carrier, wherein the attachment knob is configured to removably couple the cable carrier with the point in the wire.

6. The system of claim 1, wherein the cable carrier comprises at least twelve receiving slots, such that the cable carrier is configured to removably receive at least twelve electronics cables simultaneously.

7. The system of claim 1, wherein the plurality of posts extend laterally at an upwards angle with respect to the central body.

8. A cable carrier system for attachment of electronics cables and for positioning the electronics cables, comprising:
a wire-pulley system comprising a wire operably coupled to a first pulley wheel and a second pulley wheel: and
a cable carrier, wherein the cable carrier comprises: a central body defining an elongated vertical structure; and a plurality of posts extending laterally from the central body, wherein a first portion of the plurality of posts extend in a first direction, and a second portion of the plurality of posts extend in a second direction, opposite the first direction, wherein gaps defined between adjacent posts define receiving slots, wherein each of the plurality of receiving slots are configured to removably receive a distal end of an electronics cable, and wherein the distal end is larger than the gaps such that the electronics cable fits in one of the receiving slots with the distal end being blocked from passing through the one of the receiving slots while the electronics cable is being pulled laterally between the first pulley wheel and the second pulley wheel.

9. The cable carrier of claim 8, wherein the receiving slots comprise an engaging structure positioned within the receiving slots and coupled with a proximal portion of the receiving slots, wherein the engaging structure provides a decreased height at the proximal portion of the receiving slot relative to a distal portion of the receiving slot, such that the engaging structure is configured to provide frictional engagement with a segment of the electronics cable.

10. The cable carrier of claim 9, wherein the engaging structure is made from a deformable material, such that the engaging structure is configured to deform when the segment of the electronics cable is positioned within the receiving slot.

11. The cable carrier of claim 8, wherein the receiving slots are dimensioned such that a cable connector coupled with the distal end of the electronics cable is incapable of passing through the receiving slot, such that the electronics cable cannot be pulled through the receiving slot when a segment of the electronics cable is positioned within the receiving slot.

12. The cable carrier of claim 8, wherein the cable carrier further comprises an attachment knob extending vertically from the central body of the cable carrier, wherein the attachment knob is configured to removably couple the cable carrier with a point in the wire.

13. The cable carrier of claim 8, wherein the cable carrier comprises at least twelve receiving slots, such that the cable carrier is configured to removably receive at least twelve electronics cables simultaneously.

14. The cable carrier of claim 8, wherein the plurality of posts extend laterally at an upwards angle with respect to the central body.

* * * * *